(12) United States Patent
Yasunaga et al.

(10) Patent No.: US 6,563,199 B2
(45) Date of Patent: May 13, 2003

(54) LEAD FRAME FOR SEMICONDUCTOR DEVICES, A SEMICONDUCTOR DEVICE MADE USING THE LEAD FRAME

(75) Inventors: Shoshi Yasunaga, Kitakyushu (JP); Takahiro Ishibashi, Munakata (JP)

(73) Assignee: Mitsui High-tec Inc., Fukuoka (JP)

( * ) Notice: Subject to any disclaimer, the term of this patent is extended or adjusted under 35 U.S.C. 154(b) by 2 days.

(21) Appl. No.: 09/813,262

(22) Filed: Mar. 20, 2001

(65) Prior Publication Data

US 2001/0044169 A1 Nov. 22, 2001

(30) Foreign Application Priority Data

Mar. 21, 2000 (JP) .......................................... 2000-078362

(51) Int. Cl.[7] ............................................. H01L 23/495
(52) U.S. Cl. ........................ 257/666; 257/667; 257/673; 257/674; 257/676
(58) Field of Search ................................ 257/666, 667, 257/673, 674, 676

(56) References Cited

U.S. PATENT DOCUMENTS 5,955,778 A * 9/1999 Shingai ...................... 257/666
5,973,388 A * 10/1999 Chew et al. ................. 257/676
6,208,020 B1 * 3/2001 Minamio et al. ........... 257/684

FOREIGN PATENT DOCUMENTS

| JP | 11-233708 A | * | 2/1998 | ........... H01L/23/50 |
| JP | 11-145369 A | * | 5/1999 | ........... H01L/23/50 |
| JP | 2001-77270 A | * | 3/2001 | ........... H01L/23/50 |

* cited by examiner

*Primary Examiner*—Eddie Lee
*Assistant Examiner*—Matthew E. Warren
(74) *Attorney, Agent, or Firm*—Wood, Phillips, Katz, Clark & Mortimer

(57) ABSTRACT

A semiconductor device having a unit lead frame defining a support with a peripheral edge and a first lead spaced from the peripheral edge. The first lead has a recess formed therein. A semiconductor chip is provided on the support. A conductive element electrically connects between the semiconductor chip and the first lead. The resin layer on the semiconductor chip and the first lead extends into the recess. The invention is also directed to a unit lead frame that is part of the semiconductor device, a lead frame incorporating a plurality of unit lead frames, and a method of manufacturing semiconductor devices.

29 Claims, 4 Drawing Sheets

LEAD FRAME FOR SEMICONDUCTOR DEVICES, A SEMICONDUCTOR DEVICE MADE USING THE LEAD FRAME

BACKGROUND OF THE INVENTION

1. Field of the Invention

This invention relates to lead frames having a support for a semiconductor chip and at least one lead electrically connected to the semiconductor chip, and to a semiconductor device incorporating the lead frame. The invention also relates to a method of manufacturing semiconductor devices including a lead frame.

2. Background Art

It is known to make semiconductor devices by applying a sealing resin to a side of a lead frame having a semiconductor chip thereon. Conventional CSP (chip scale packaging) technology includes SON (Small Outline Non-leaded) and QFN (Quad Flat Non-leaded) semiconductor devices. The semiconductor chips may be loaded on supports on the lead frames at predetermined intervals using heat resistant adhesive which fixes the semiconductor chips when the adhesive cures. Electrode pads on the semiconductor chips are electrically connected to multiple leads extending around the support through the use of conductive elements, such as wires. The lead frame may incorporate multiple unit lead frames which are interconnected through a tie bar network. In conventional processes, multiple semiconductor chips are mounted, wired, and simultaneously sealed. Individual semiconductor devices are then separated through a cutting operation.

This conventional technology has a number of drawbacks. With this process, the semiconductor chips and sealing resin are formed on one side of the lead frame. During a cutting process in which individual semiconductor devices are separated, the lead frame is cut together with the sealing resin by an appropriate mechanism, such as a saw blade. Since there is a difference in hardness between the lead frame and the resin, the cutting resistance varies during the cutting process. Accordingly, there is a potential problem of peeling between the resin and the unit lead frames, particularly at the leads.

Additionally, because the sealing resin adheres on only one side of the lead frame, the adherence of the resin to the lead frame may not be satisfactory. Peeling of the sealing resin may result.

SUMMARY OF THE INVENTION

In one form, the invention is directed to a semiconductor device having a unit lead frame defining a support with a peripheral edge and a first lead spaced from the peripheral edge. The first lead has a recess form therein. A semiconductor chip is provided on the support. A conductive element electrically connects between the semiconductor chip and the first lead. A resin layer is applied to the semiconductor chip and the first lead and extends into the recess.

In one form, the conductive element is a wire with an end that is connected to the first lead in the recess.

In one form, the recess extends only partially through the first lead.

In one form, there is an entry opening on the first lead in communication with the recess and the recess is configured so that solidified resin in the recess cannot be drawn through the entry opening to escape from the recess.

Resin in the resin layer may be solidified in the recess around the wire end connected to the first lead in the recess.

The recess may have a V shape in cross section, with the apex of the V located at the entry opening.

The recess may have an elongate shape.

In one form, the lead has a length and the recess is elongate and extends in a direction substantially parallel to the length of the first lead.

In one form, there are a plurality of leads in addition to the first lead spaced from the peripheral edge and there is a recess formed in each of the plurality of leads.

In one form, the support has a surface facing in the first direction to which the semiconductor chip attaches, the recess defines a first shoulder facing oppositely to the first direction, and resin in the resin layer solidified in the recess abuts to the first shoulder to prevent withdrawal of solidified resin from the recess by movement in the first direction.

The invention is also directed to a lead frame for a plurality of semiconductor devices. The lead frame has a layer defining a plurality of unit lead frames and a tie bar network interconnecting the plurality of unit lead frames. A first unit lead frame in the plurality of unit lead frames has a first support with a peripheral edge and a first lead spaced from the peripheral edge. The first lead has a recess formed therein to accept at least one of a) a conductive element which electrically connects to the first lead and b) resin which can be applied to the lead frame.

The lead frame may include a second unit lead frame in the plurality of unit lead frames, which second unit lead frame has a second support with a peripheral edge and a second lead spaced from the peripheral edge of the second support. The tie bar network includes a first tie bar connecting between the first and second leads.

In one form, the second lead has a recess formed therein to accept at least one of a) a conductive element which electrically connects to the second lead and b) resin which can be applied to the lead frame, and the recesses in the first and second leads connect to each other through the first tie bar.

The first support may have a polygonal shape, with the peripheral edge of the first support defined by a plurality of substantially straight edge portions. The one lead and at least one additional lead project from one of the straight edge portions, with the tie bar network including a first tie bar connecting the one lead and the one additional lead.

In one form, the second unit lead frame has a second support with a peripheral edge and a second lead spaced from the peripheral edge of the second support, with the first tie bar connecting to the second lead.

The second lead may have a recess formed therein to accept at least one of a) a conductive element which electrically connects to the second lead and b) resin which can be applied to the lead frame.

The recesses in the first and second leads may connect to each other through the first tie bar.

In one form, the recess in the first lead extends only partially through the first lead.

In one form, there is an entry opening in communication with the recess and the recess is configured so that solidified resin in the recess cannot be drawn through the entry opening to escape from the recess.

The recess may be elongate.

The recess may have a V shape in cross section with the apex of the V located at the entry opening.

In one form, the first lead has a length and the recess is elongate and extends in a direction substantially parallel to the length of the first lead.

The first support may have a surface facing in a first direction for supporting a semiconductor device, with the recess defining a first shoulder facing oppositely to the first direction so that solidified material in the recess is abuttable to the first shoulder to prevent withdrawal from the recess by movement in the first direction.

The invention is also directed to a unit lead frame for a semiconductor device, which unit lead frame has a support with a peripheral edge and a first lead space from the peripheral edge. The first lead has a recess formed therein to accept at least one of a) a conductive element which electrically connects to the first lead and b) resin which can be applied to the lead frame.

The recess may extend only partially through the first lead.

In one form, there is an entry opening in communication with the recess and the recess is configured so that solidified material in the recess cannot be drawn through the entry opening to escape from the recess.

In one form, the recess has a V shape in cross section with the apex of the V located at the entry opening.

The recess may have an elongate shape.

In one form, the lead has a length and the recess is elongate and extends in a direction substantially parallel to the length of the lead.

In one form, there are a plurality of leads in addition to the first lead spaced from the peripheral edge.

In one form, there is a recess formed in each of the plurality of leads, each to accept a conductive element which electrically connects to each of the plurality of leads.

The support may have a surface facing in a first direction for supporting a semiconductor device, the recess defining a direction so that solidified material in the recess is abuttable to the first shoulder to prevent withdrawal from the recess by movement in the first direction.

The invention is further directed to a method of manufacturing a plurality of semiconductor devices. The method includes the steps of: forming a lead frame having a layer defining a plurality of unit lead frames and a tie bar network interconnecting the plurality of unit lead frames, a first unit lead frame in the plurality of unit lead frames having a first support with a peripheral edge and a first lead spaced from the peripheral edge; placing a semiconductor chip on the first support; forming a recess in the first lead; electrically connecting the semiconductor chip and the first lead through a conductive element; forming a resin layer over the semiconductor chip and first lead and into the recess; and cutting the lead frame to separate the first unit lead frame, semiconductor chip, and conductive element.

The recess may be formed through an etching process.

The recess may be formed only partially through the first lead.

In one form, there is a second unit lead frame in the plurality of unit lead frames including a second support with a peripheral edge and a second lead spaced from the peripheral edge on the second support. The step of forming a lead frame may involve forming a tie bar network having a first tie bar that connects the first and second leads.

The cutting step may involve cutting through the first tie bar.

The recess may be formed as an elongate recess through the first and second leads and the first tie bar.

In one form, the lead frame has first and second oppositely facing sides, the resin layer is provided on one of the oppositely facing sides, and the process further involves applying a sealing layer on the other of the oppositely facing sides.

The sealing layer may be removed after forming the resin layer.

In one form, the first lead has a length and spaced sides and the step of forming a recess involves forming an elongate recess extending lengthwise of the first lead substantially midway between the spaced side.

The conductive element may be connected to the first lead within the recess.

In one form, the first support has a surface facing in a first direction against which the semiconductor chip is placed and the recess has a shoulder facing oppositely to the first direction. The method may further include the step of solidifying resin in the resin layer in the recess so that solidified resin in the recess abuts to the first shoulder so that the solidified resin cannot be withdrawn from the recess by movement in the first direction.

DETAILED DESCRIPTION OF THE DRAWINGS

Figure 1:
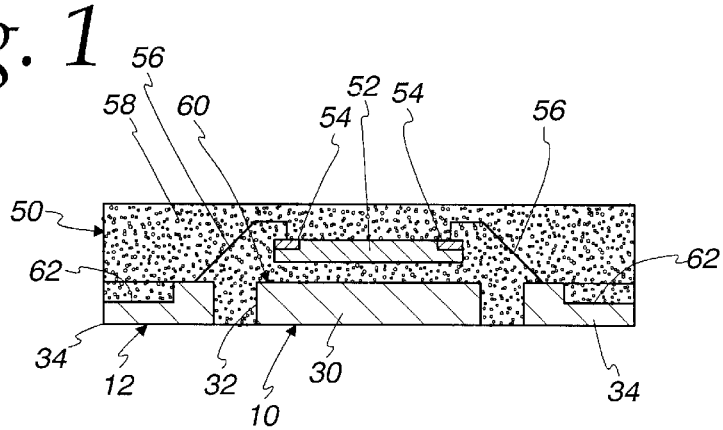
FIG. 1 is a cross-sectional view of a semiconductor device made according to the present invention.
Figure 2:
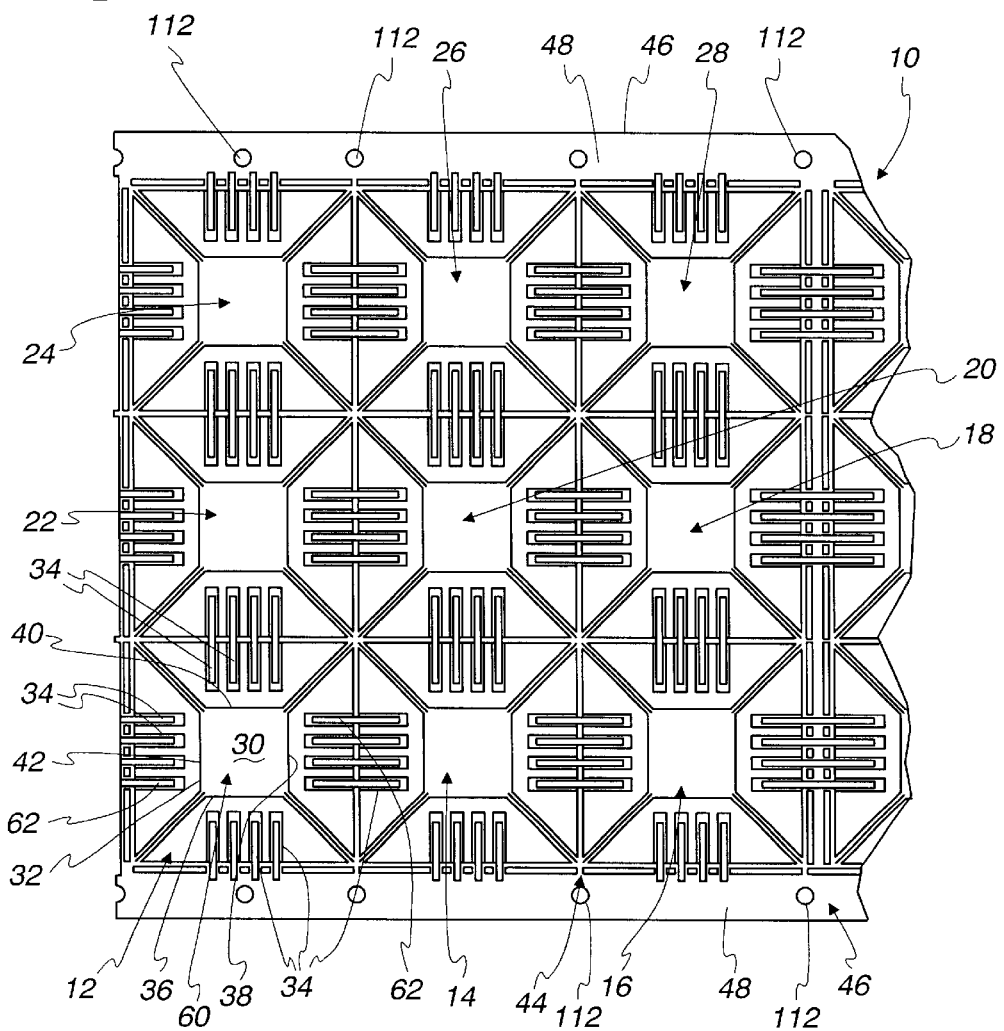
FIG. 2 is a fragmentary, plan view of a lead frame including unit lead frames, of the type incorporated into the semiconductor device of FIG. 1, and interconnected by a tie bar network.

A lead frame, according to the present invention, is shown at 10 in FIGS. 1 and 2. The lead frame 10 consists of a plurality of unit lead frames 12, 14, 16, 18, 20, 22, 24, 26, 28 arranged in a 3×3 matrix form. Exemplary unit lead frame 12 consists of a support 30 with a peripheral edge 32 bounding a polygonal shape, in this case a square. Multiple, and in this case four, leads 34 are provided in spaced relationship at each of four edge portions 36, 38, 40, 42.

The unit lead frames 12–28 are interconnected by a tie bar network 44. A layer 46 defines the unit lead frame 12–18 and a guide rail 48.

As seen in FIG. 1, exemplary unit lead frame 12 is part of a semiconductor device at 50. The semiconductor device 50 has a semiconductor chip 52 loaded on the support 30. Electrode pads 54 are electrically connected to the leads 34 through conductive elements, in this case wires 56. A layer of resin 58 is applied over one side 60 of the lead frame 12 and embeds the wires 56 and semiconductor chips 52.

According to the invention, recesses 62 are etched in the leads 34 on the side 60 of the unit lead frames 12. The configuration of the recesses 62 will be described in greater detail hereafter. The resin 58 is applied so as to migrate into, and be solidified within, the recesses 62 to prevent separation of the resin 58 upwardly in FIG. 1 from the unit lead frame 12. Additionally, as also described hereinafter, the electrical connection between each of the wires 56 and leads 34 is preferably established within a recess 62.

Figure 5:
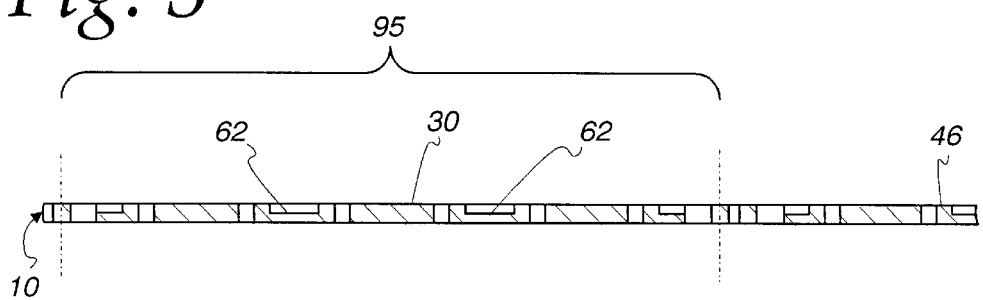
FIG. 5 is a cross-sectional view of the lead frame of FIG. 2.

The process for making the lead frame 10 and forming the individual semiconductor devices 50 will now be described. As shown in FIGS. 2 and 5, the layer 46 is constructed from a metal conductive plate in the form of a strip, sheet, or belt. The unit lead frames 12–28 and tie bar network 44 may be formed by any method known to those skilled in the art, such as by etching or cutting.

Figure 3:
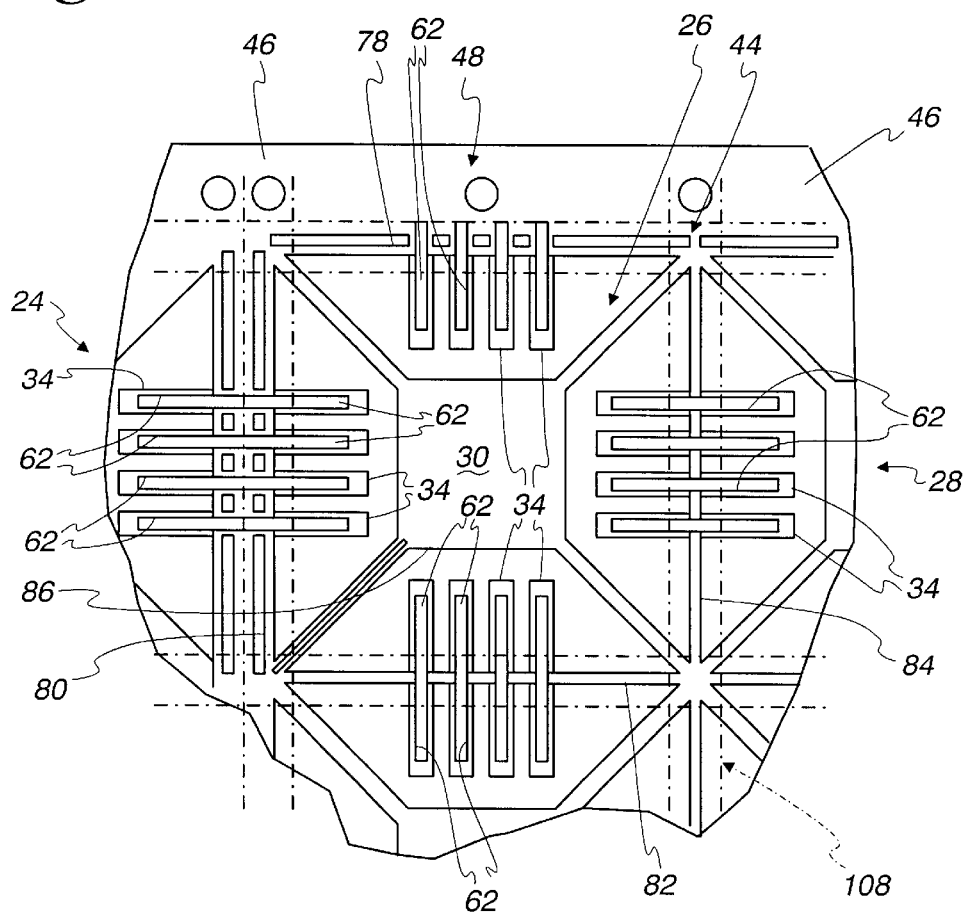
FIG. 3 is an enlarged, fragmentary, plan view of one of the lead frames on the lead frame in FIG. 2.
Figure 4:
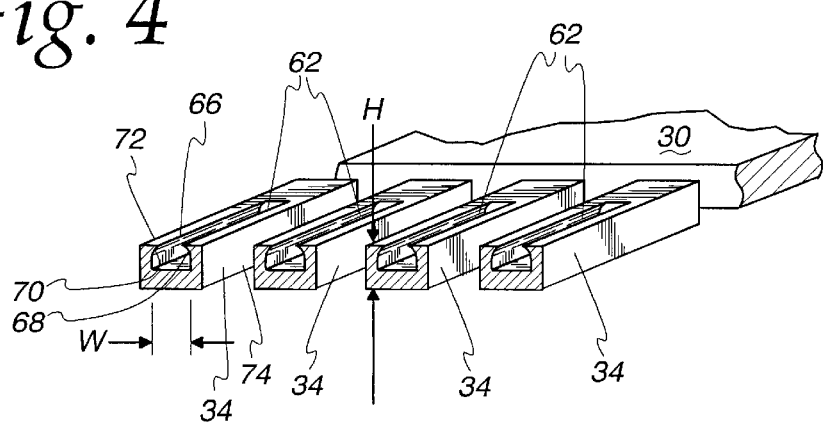
FIG. 4 is a fragmentary, perspective view of a part of one of the unit lead frames in FIG. 3 and showing the relationship between a support on the unit lead frame and leads at one edge portion thereof and having recesses formed therein.

As shown in FIGS. 3 and 4, the recesses 62 in the leads 34 are formed by an etching process. The wires 56 are electrically connected to the leads 34 within the recesses 62 (see FIG. 1). By varying the time of immersion in the etching liquid, the width W of the recesses 62 can be altered to produce a recess 62 of varying cross-sectional configuration. A restricted entry opening 66 communicates with each recess 62. By reason of controlling the etching process, the recess has a V shape or dovetail shape, opening from top to bottom with the apex of the "V" at the entry opening 66. As a result, resin 58 solidified within the recess 62 cannot be withdrawn through the restricted entry opening 66. In this embodiment, shoulders 68, 70 defined by each recess 62 prohibit the withdrawal of the solidified resin from the recess 62 by movement in the direction of the arrow 71 in FIG. 4.

Preferably, the leads 34 have an elongate configuration, with a length projecting away from the support 30. The recesses 62 are elongate, with the length thereof extending generally parallel to the length of the leads 34. The recesses 62 are substantially centered between laterally spaced sides 72, 74 on each lead 72 and extend only partially therethrough, and, in the embodiment shown, on the order of at least one-half the height dimension H of each lead 34.

The tie bar network 44 consists of tie bars which extend around the individual unit lead frames 12–28. In FIG. 3, exemplary unit lead frame 26 has tie bars 78, 80, 82, 84 extending around the peripheral edge 86 of the support 30 and having a shape conforming thereto.

Figure 6:
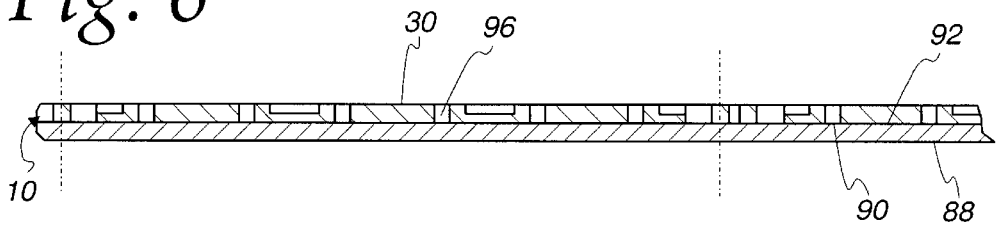
FIG. 6 is a view as in FIG. 5 with a sealing layer placed on one side of the lead frame.

As shown in FIG. 6, a sealing layer 88 is applied to the underside 90 of the lead frame 10. The sealing layer 88 may be a heat resistant tape applied with an adhesive layer 92.

Figure 7:
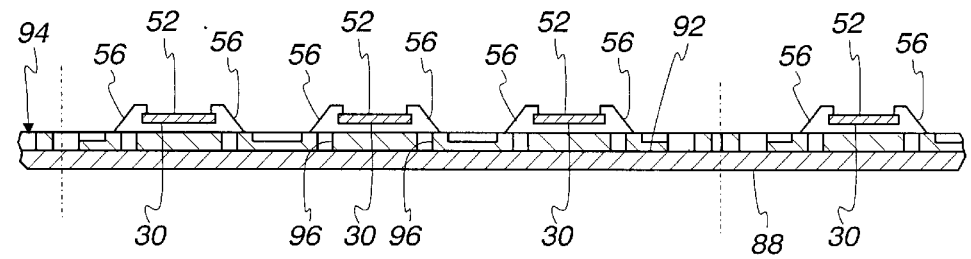
FIG. 7 is a view as in FIGS. 5 and 6 with semiconductor chips mounted on and wired to the lead frame.

As shown in FIG. 7, semiconductor chips 52 are loaded on the supports 30 of each unit lead frame 12–28. The semiconductor chips 52 are then electrically connected to the leads 34 through the wires 56.

Figure 8:
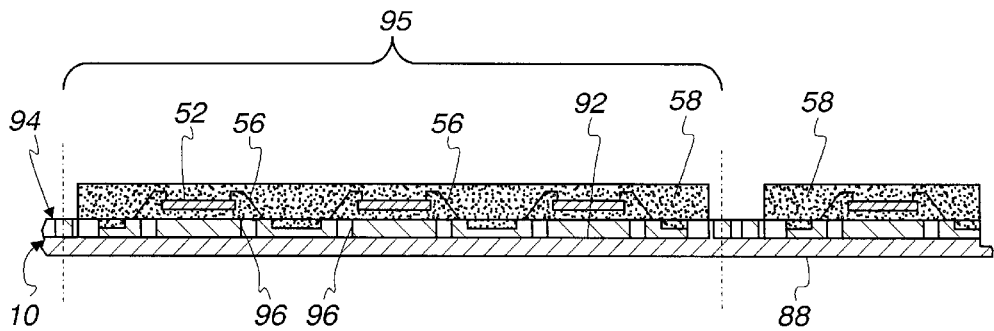
FIG. 8 is a view as in FIGS. 5–7 with a layer of sealing resin applied to and solidified on one side of the lead frame.

As seen in FIG. 8, the resin 58 is applied over the top side 94 of the lead frame 10 in the region 95, so as to embed the wires 56 and semiconductor chips 52. The resin 58 fills the spaces 96 between the supports 30 and the leads 34 so that the lead frame 10 positively bonds with the resin 58. Migration of resin 58 to the underside 90 of the lead frame 10 is prevented. By reason of the positive embedding of the lead frame 10 in the resin 58, the lead frame structure of FIG. 8 is rigid and stable between the sides of the guide rail 48.

The resin 58 migrates into the recesses 62 and is solidified during a curing process. Because of the configuration of the recesses 62, attempted withdrawal of the solidified resin through the entry opening 66 is blocked by the lead 34 and thus prohibited. As a result, the solidified resin within the recesses 62 effectively becomes anchored to each of the leads 34.

Figure 9:
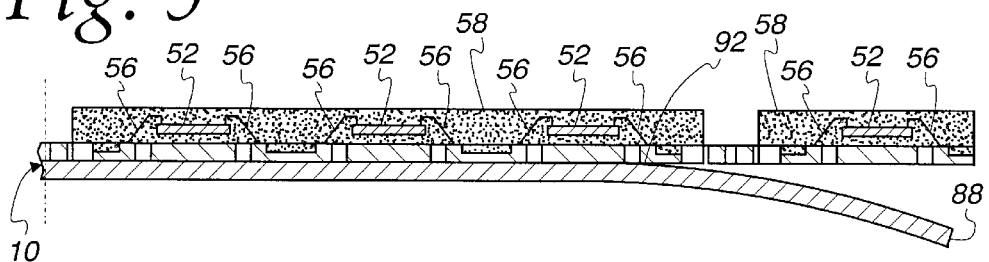
FIG. 9 is a view as in FIG. 8 with the sealing layer being removed from the lead frame.

As shown in FIG. 9, by heating and softening the adhesive layer 92, the sealing layer 88 can be separated from the lead frame 10.

Figure 10:
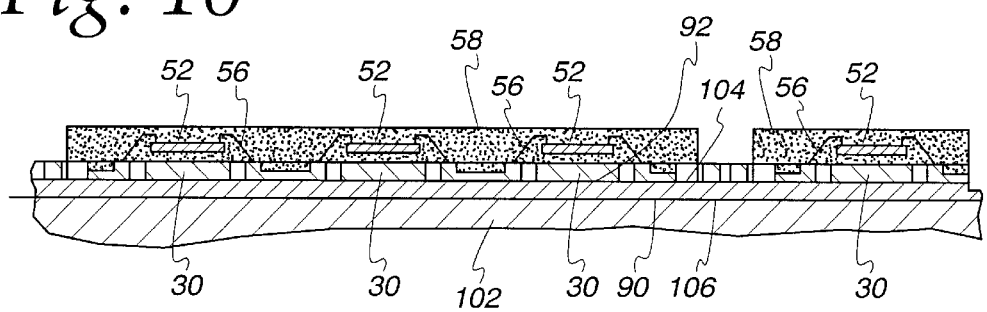
FIG. 10 is a cross-sectional view of a lead frame with semiconductor chips mounted thereto and a sealing resin layer applied as in FIG. 8 and in which a fixing layer is used to connect the lead frame to a jig.
Figure 11:
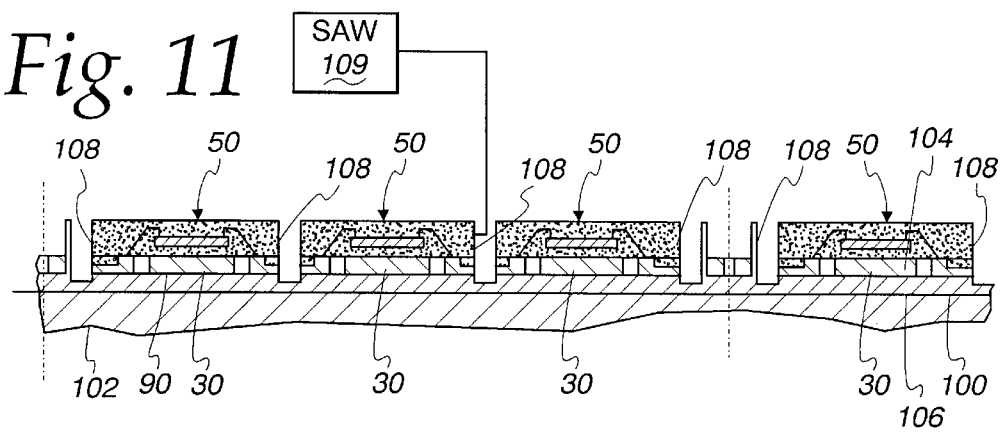
FIG. 11 is a view as in FIG. 10 with the structure cut to define individual semiconductor devices.

As seen in FIGS. 10 and 11, a fixing layer 100 can be applied to the underside 90 of the lead frame 10. The fixing layer 100 may be made from a UV sheet that is dried by exposure to ultraviolet light. The lead frame 10 is then adhered to a jig 102. The fixing layer 100 may be made with adhesive coating 104, 106 on opposite sides thereof to adhere to the lead frame 100 and the jig 102.

As seen in FIG. 11, the individual semiconductor devices 50 are separated by cutting along lines 108 fully around the periphery of the supports 30. A conventional type saw 109 may be used for this purpose. The individual semiconductor devices 50 are then removed from the fixing layer 100.

Since the solidified resin in the layer 58 is effectively wedged in the recesses 62, the resistance to peeling of the resin 58 from the lead frame 10 is increased. In the absence of this arrangement, the difference in cutting resistance encountered by a blade on the saw 109 between the resin 58 and the conductive lead frame 10 would tend to delaminate the resin 58.

Uniform filling of the recesses 62 with the resin 58 is facilitated by having the recesses 62 extend continuously from leads 34 on adjacent unit lead frames 12–28 to an exemplary tie bar 84 (see FIG. 2) which extends between and connects these leads. The recesses 62 preferably extend continuously through the tie bar 84 as well. Accordingly, uniform flow of resin through the recesses 62 is facilitated.

Figure 12:
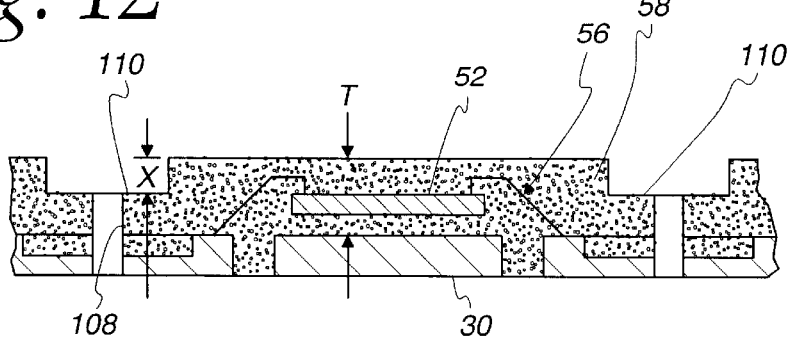
FIG. 12 is a fragmentary, cross-sectional view of connected semiconductor devices made as described with respect to FIGS. 5–9 or 10 and 11 and in which a step is formed in the sealing resin to reduce cutting resistance.

Several variations of the above described structure and process are contemplated. As just one example, shown in FIG. 12, a step 110 may be formed in the resin layer 58 to thereby effectively reduce the thickness T of the resin layer by an amount indicated by the dimension X. Accordingly, when the cut 108 is made, the saw blade need not go through the full thickness T of the resin 58 over the support 30.

While the wires 56 are described to be electrically connected to the leads 34 within the recesses 62, this is not necessary. The recesses 62 can be provided primarily to anchor the resin layer 58 to the lead frame 10. However, by embedding the connection of the ends of the wires 56 within the recesses 62, electrical connection may be more positively established and maintained.

Other configurations of the recesses 62 are contemplated. For example, any recess structure that produces a shoulder which prevents withdrawal from the recess 62, and therefore delamination of the resin, is contemplated by the invention.

The invention also contemplates that holes can be formed in the resin 58 around the lead frame 10 to reduce the amount of resin that must be severed as the completed semiconductor devices are separated.

As shown in FIG. 2, positioning holes 112 may be provided through the guide rail 48 to facilitate positive location and positioning of the lead frame 10. This facilitates positive alignment between the semiconductor chips 52 and wires 56 attached to the lead frame 10 during the manufacturing process. Furthermore, consistent application of the resin 58 to the lead frame 10 may be facilitated.

The foregoing disclosure of specific embodiments is intended to be illustrative of the broad concepts comprehended by the invention.

What is claimed is:

1. A semiconductor device comprising:
   a unit lead frame comprising a support with a peripheral edge and a first lead spaced from the peripheral edge,
   the first lead having a recess formed therein and extending only partially through the first lead;
   a semiconductor chip on the support;
   a conductive element electrically connecting between the semiconductor chip and the first lead; and
   a resin layer on the semiconductor chip and the first lead and extending into the recess,
   wherein there is an entry opening on the first lead in communication with the recess, the recess and entry opening being configured so that solidified resin in the recess is blocked by the first lead from being withdrawn from the recess through the entry opening.

2. The semiconductor device according to claim 1 wherein the conductive element comprises a wire with an end that is connected to the first lead in the recess.

3. The semiconductor device according to claim 2 wherein resin in the resin layer is solidified in the recess around the wire end connected to the first lead in the recess.

4. The semiconductor device according to claim 1 wherein the recess and the entry opening have an elongate shape.

5. The semiconductor device according to claim 1 wherein the first lead has a length with first and second lengthwise ends, with the first lengthwise end being closer to the support than the second lengthwise end, and the recess is elongate and has a length that extends in a direction substantially parallel to the length of the first lead fully to the second lengthwise end.

6. The semiconductor device according to claim 1 wherein there are a plurality of leads in addition to the first lead spaced from the peripheral edge and there is a recess formed in each of the plurality of leads.

7. The semiconductor device according to claim 1 wherein the support has a surface facing in a first direction to which the semiconductor chip attaches, the recess defines a first shoulder facing oppositely to the first direction and resin within the resin layer solidified in the recess abuts to the first shoulder to prevent withdrawal of solidified resin from the recess by movement in the first direction.

8. A semiconductor device comprising:
   a unit lead frame comprising a support with a peripheral edge and a first lead spaced from the peripheral edge,
   the first lead having a recess formed therein;
   a semiconductor chip on the support;
   a conductive element electrically connecting between the semiconductor chip and the first lead; and
   a resin layer on the semiconductor chip and the first lead and extending into the recess,
   wherein the conductive element comprises a wire with an end that is connected to the first lead in the recess,
   wherein the recess extends only partially through the first lead,
   wherein there is an entry opening on the first lead in communication with the recess and the recess is configured so that solidified resin in the recess cannot be drawn through the entry opening to escape from the recess,
   wherein resin in the resin layer is solidified in the recess around the wire end connected to the first lead in the recess,
   wherein the recess has a V shape in cross section with the apex of the V located at the entry opening.

9. A lead frame for a plurality of semiconductor devices, said lead frame comprising:
   a layer defining a plurality of unit lead frames and a tie bar network interconnecting the plurality of unit lead frames,
   a first unit lead frame in the plurality of unit lead frames comprising a first support with a peripheral edge and a first lead spaced from the peripheral edge,
   the first lead having a recess formed therein to accept at least one of a) a conductive element which electrically connects to the first lead and b) resin which can be applied to the lead frame and an entry opening in communication with the recess, the first lead defining a shoulder which faces into the recess so as to abut a solidified material in the recess to block withdrawal of a solidified material in the recess through the entry opening.

10. The lead frame for a plurality of semiconductor devices according to claim 9 wherein there is second unit lead frame in the plurality of unit lead frames, the second unit lead frame comprising a second support with a peripheral edge and a second lead spaced from the peripheral edge of the second support and the tie bar network comprises a first tie bar connecting between the first and second leads.

11. The lead frame for a plurality of semiconductor devices according to claim 10 wherein the second lead has a recess formed therein to accept at least one of a) a conductive element which electrically connects to the second lead and b) resin which can be applied to the lead frame and the recesses in the first and second leads connect to each other through the first tie bar.

12. The lead frame for a plurality of semiconductor devices according to claim 9 wherein the first support has a polygonal shape with the peripheral edge of the first support defined by a plurality of substantially straight edge portions, the one lead and at least one additional lead project from one of the straight edge portions and the tie bar network comprises a first tie bar connecting the one lead and the one additional lead.

13. The lead frame for a plurality of semiconductor devices according to claim 12 wherein there is a second unit lead frame in the plurality of unit lead frames, the second unit lead frame comprises a second support with a peripheral edge and a second lead spaced from the peripheral edge of the second support and the first tie bar connects to the second lead.

14. The lead frame for a plurality of semiconductor devices according to claim 13 wherein the second lead has a recess formed therein to accept at least one of a) a conductive element which electrically connects to the second lead and b) resin which can be applied to the lead frame.

15. The lead frame for a plurality of semiconductor devices according to claim 14 wherein the recesses in the first and second leads connect to each other through the first tie bar.

16. The lead frame for a plurality of semiconductor devices according to claim 15 wherein the recess in the first lead extends only partially through the first lead.

17. The lead frame for a plurality of semiconductor devices according to claim 16 wherein the recess and entry opening are elongate.

18. The lead frame for a plurality of semiconductor devices according to claim 17 wherein the first lead has a length and the recess has a length that extends in a direction substantially parallel to the length of the lead.

19. The lead frame for a plurality of semiconductor devices according to claim 9 wherein the first support has a surface facing in a first direction for supporting a semiconductor device, and the shoulder faces oppositely to the first direction so that solidified material in the recess is abuttable to the shoulder to prevent withdrawal from the recess by movement in the first direction.

20. A lead frame for a plurality of semiconductor devices, said lead frame comprising:

a layer defining a plurality of unit lead frames and a tie bar network interconnecting the plurality of unit lead frames, a first unit lead frame in the plurality of unit lead frames comprising a first support with a peripheral edge and a first lead spaced from the peripheral edge, the first lead having a recess formed therein to accept at least one of a) a conductive element which electrically connects to the first lead and b) resin which can be applied to the lead frame, wherein the first support has a polygonal shape with the peripheral edge of the first support defined by a plurality of substantially straight edge portions, the one lead and at least one additional lead project at one of the straight edge portions and the tie bar network comprises a first tie bar connecting the one lead and the one additional lead, wherein there is a second unit lead frame in the plurality of unit lead frames, the second unit lead frame comprises a second support with a peripheral edge and a second lead spaced from the peripheral edge of the second support and the first tie bar connects to the second lead, wherein the second lead has a recess formed therein to accept at least one of a) a conductive element which electrically connects to the second lead and b) resin which can be applied to the lead frame, wherein the recesses in the first and second leads connect to each other through the first tie bar, wherein the recess in the first lead extends only partially through the first lead, wherein there is an entry opening in communication with the recess and the recess is configured so that solidified resin in the recess cannot be drawn through the entry opening to escape from the recess, wherein the recess has a V shape in cross section with the apex of the V located at the entry opening.

21. A unit lead frame for a semiconductor device, said unit lead frame comprising:

a support with a peripheral edge and a first lead spaced from the peripheral edge, the first lead having a recess formed therein to accept at least one of a) a conductive element which electrically connects to the first lead and b) resin which can be applied to the lead frame and an entry opening in communication with the recess, the first lead defining a shoulder which faces into the recess so as to abut a solidified material in the recess to block withdrawal of a solidified material in the recess through the entry opening.

22. The unit lead frame according to claim 21 wherein the recess extends only partially through the first lead.

23. The unit lead frame according to claim 22 wherein the recess and entry opening have an elongate shape.

24. The unit lead frame according to claim 22 wherein the lead has a length and the recess has a length that extends in a direction substantially parallel to the length of the lead.

25. The unit lead frame according to claim 21 wherein there are a plurality of leads in addition to the first lead spaced from the peripheral edge.

26. The unit lead frame according to claim 25 wherein there is a recess formed in each of the plurality of leads each to accept a conductive element which electrically connects to each of the plurality of leads.

27. The unit lead frame according to claim 21 wherein the support has a surface facing in a first direction for supporting a semiconductor device, the recess defines a first shoulder facing oppositely to the first direction so that solidified material in the recess is abuttable to the first shoulder to prevent withdrawal from the recess by movement in the first direction.

28. A unit lead frame for a semiconductor device, said unit lead frame comprising:

a support with a peripheral edge and a first lead spaced from the peripheral edge, the first lead having a recess formed therein to accept at least one of a) a conductive element which electrically connects to the first lead and b) resin which can be applied to the lead frame, wherein the recess has an entry opening in communication with the recess and the recess extends only partially through the first lead, wherein the recess has a V shape in cross section with the apex of the V located at the entry opening.

29. A semiconductor device comprising:

a unit lead frame comprising a support with a peripheral edge and a first lead spaced from the peripheral edge, the first lead having a recess formed therein;

a semiconductor chip on the support;

a conductive element electrically connecting between the semiconductor chip and the first lead; and a resin layer on the semiconductor chip and the first lead and extending into the recess, wherein the recess has a V shape in cross section with the apex of the V located at the entry opening.

* * * * *